(12) United States Patent
Gärtner et al.

(10) Patent No.: US 9,773,776 B2
(45) Date of Patent: Sep. 26, 2017

(54) LIGHTING MODULE FOR EMITTING MIXED LIGHT

(71) Applicant: OSRAM Opto Semiconductors GmbH, Regensburg (DE)

(72) Inventors: Christian Gärtner, Regensburg (DE); Ales Markytan, Regensburg (DE); Jan Marfeld, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/157,853

(22) Filed: May 18, 2016

(65) Prior Publication Data

US 2016/0329316 A1 Nov. 10, 2016

Related U.S. Application Data

(63) Continuation of application No. 13/981,152, filed as application No. PCT/EP2012/050722 on Jan. 18, 2012, now Pat. No. 9,368,547.

(30) Foreign Application Priority Data

Jan. 28, 2011 (DE) .................. 10 2011 009 697

(51) Int. Cl.
*H01L 27/02* (2006.01)
*H05B 33/08* (2006.01)
(Continued)

(52) U.S. Cl.
CPC ............ *H01L 27/0248* (2013.01); *F21K 9/60* (2016.08); *H01L 25/167* (2013.01); *H01L 27/156* (2013.01); *H01L 33/30* (2013.01); *H01L 33/32* (2013.01); *H01L 33/502* (2013.01); *H01L 33/56* (2013.01); *H05B 33/089* (2013.01); *H05B 33/0845* (2013.01); *H05B 33/0857* (2013.01); *F21Y 2115/10* (2016.08)

(58) Field of Classification Search
CPC ..... H01L 27/156; H01L 25/167; H01L 33/30; H01L 33/32; H01L 33/502; H01L 27/0248
See application file for complete search history.

(56) References Cited

U.S. PATENT DOCUMENTS

| | | | |
|---|---|---|---|
| 2007/0171159 A1 | 7/2007 | Lee | |
| 2008/0111505 A1 | 5/2008 | Wang | |
| 2011/0291129 A1* | 12/2011 | Wirth | ............. H05B 33/0857 257/89 |

FOREIGN PATENT DOCUMENTS

| | | |
|---|---|---|
| CN | 1716074 A | 1/2006 |
| CN | 201628103 | 11/2010 |
| DE | 102008057347 | 5/2010 |

* cited by examiner

*Primary Examiner* — Matthew Reames
(74) *Attorney, Agent, or Firm* — Occhiuti & Rohlicek LLP

(57) ABSTRACT

A lighting module for emitting mixed light comprises at least one first semiconductor element which emits unconverted red light, at least one second semiconductor element which emits converted greenish white light having a first conversion percentage, at least one third semiconductor element which emits greenish white light having a second conversion percentage that is smaller than the first conversion percentage, and at least one resistor element having a temperature-dependent electric resistance, the second semiconductor element being connected in parallel to the third semiconductor element.

11 Claims, 3 Drawing Sheets

(51) Int. Cl.
  *H01L 27/15*    (2006.01)
  *F21K 9/60*     (2016.01)
  *H01L 25/16*    (2006.01)
  *H01L 33/30*    (2010.01)
  *H01L 33/32*    (2010.01)
  *H01L 33/50*    (2010.01)
  *H01L 33/56*    (2010.01)
  *F21Y 115/10*   (2016.01)

LIGHTING MODULE FOR EMITTING MIXED LIGHT

CROSS REFERENCE TO RELATED APPLICATIONS

This application is a continuation application of U.S. application Ser. No. 13/981,152, filed Oct. 2, 2013, which is the National Stage of International Application No. PCT/EP2012/050722, filed on Jan. 18, 2012, which claims the priority of German Application No. 102011009697.3, filed on Jan. 28, 2011. The contents of which are hereby incorporated by reference in their entirety.

FIELD OF DISCLOSURE

A lighting module for emitting mixed light is specified, which comprises a plurality of semiconductor components which emit light at different wavelengths. In particular, the lighting module generates white light during operation.

BACKGROUND

Lighting devices which emit white light can be achieved, for example, by the combination of one or a plurality of red-emitting LEDs with one or a plurality of so-called conversion LEDs, which generate blue light which is converted into light having a different wavelength, for example greenish-white light, in a conversion layer. The respective operating current of the LEDs used is adapted in such a way that the superimposition of the light emitted by all the LEDs produces white light on the white curve of a Planckian black-body radiator.

What is problematic in the operation of the lighting device is the different temperature behavior and aging behavior of the red-emitting and greenish-white-emitting LEDs, which has the consequence that the color locus of the lighting device is difficult to stabilize on account of the temperature dependence.

SUMMARY

One object to be achieved in the present case is to specify a lighting module having a comparatively temperature-stable color locus.

In accordance with one preferred embodiment, the lighting module provided for emitting mixed light comprises at least one first semiconductor component, which emits unconverted red light, at least one second semiconductor component which emits converted greenish-white light having a first conversion proportion, and at least one third semiconductor component which emits converted greenish-white light having a second conversion proportion, which is less than the first conversion proportion. Furthermore, the lighting module comprises at least one resistance element having a temperature-dependent electrical resistance. Preferably, the second semiconductor component is connected in parallel with the third semiconductor component.

The second conversion proportion of the light emitted by the third semiconductor component can tend toward zero, such that the third semiconductor component emits blue light.

As a result of the parallel connection of the second semiconductor component relative to the third semiconductor component, it is advantageously possible for a different current to flow through the second semiconductor component compared with the current that flows through the third semiconductor component. Consequently, the first and the second conversion proportion and the total conversion proportion can be correspondingly set by means of a suitable energization of the two semiconductor components.

The first semiconductor component is interconnected with the resistance element, the second and the third semiconductor component in such a way that a color locus of the mixed light is stable as the temperature increases.

The first semiconductor component can comprise, for example, a red-emitting InGaAlP semiconductor chip. In this case, the problem occurs that the light intensity decreases as the temperature rises. Furthermore, the second and third semiconductor components can comprise InGaN semiconductor chips, in which the light intensity changes to a lesser extent than in the case of the InGaAlP semiconductor chip as the temperature increases. Consequently, in the event of a rise in temperature, the color locus of the mixed light would be shifted in the direction of blue color coordinates.

Furthermore, the second and third semiconductor components each comprise a conversion element comprising at least one conversion substance. In accordance with a first variant, the conversion element has a negative temperature coefficient. In accordance with a second variant, the conversion element has a positive temperature coefficient.

In a conversion element having a negative temperature coefficient, the problem occurs that the conversion element is less efficient as the temperature rises. As a result, it is possible for the color locus of the second and third semiconductor components to be shifted in the direction of blue color locus coordinates as the temperature rises.

A conversion element having a positive temperature coefficient is more efficient as the temperature rises, since the conversion proportion increases on account of increased scattering. As a result, it is possible for the color locus of the second and third semiconductor components to be shifted in the direction of green color locus coordinates as the temperature rises.

By means of the temperature-dependent electrical resistance, the operating current of at least one of the semiconductor components of the lighting module can advantageously be changed in a manner dependent on the temperature, in order to stabilize the color locus coordinates of the mixed light in the event of temperature changes.

Advantageously, the lighting module is constructed in terms of circuitry in such a way that a one-channel driver suffices for operating the entire lighting module.

In one advantageous configuration, the lighting module comprises a string comprising the resistance element and the third semiconductor component, wherein the resistance element forms a series circuit with the third semiconductor component. In particular, in this configuration, the resistance element has a positive temperature coefficient (so-called PTC resistance) if the conversion element has a negative temperature coefficient. The electrical resistance of the resistance element increases as the temperature rises, such that less current flows through the third semiconductor component. At the same time, the current through the first semiconductor component decreases as the temperature rises. By means of the resistance element having a positive temperature coefficient, the light intensity of the light emitted by the third semiconductor component can be reduced, such that it is possible to counteract a temperature-dictated shift in the color locus of the mixed light in the direction of blue color coordinates on account of the decrease in the red proportion. At the same time, as a result of the decreasing energization of the third semiconductor component, which has a larger blue primary light proportion by comparison with the second semiconductor component, less blue light is generated, thus counteracting a shift in the color locus of the mixed light on account of decreasing efficiency of the conversion substance.

In this embodiment, it is possible for the first and the second semiconductor component to form a parallel circuit or a series circuit.

If the conversion element has a positive temperature coefficient, the lighting module advantageously comprises a string comprising the resistance element and the second semiconductor component, wherein the resistance element has a positive temperature coefficient. In this case, less current flows through the second semiconductor component as the temperature increases, such that it is possible to counteract an increase in the green conversion proportion. This furthermore counteracts a temperature-dictated shift in the color locus of the mixed light in the direction of green color coordinates. In this embodiment, at the same time the current through the first semiconductor component decreases as the temperature rises.

In this embodiment, the first and the third semiconductor component form a parallel circuit or a series circuit.

An alternative embodiment provides a string comprising the resistance element and the first and second semiconductor components, wherein the resistance element forms a series circuit with the first and second semiconductor components and has a negative temperature coefficient (so-called NTC resistance). Preferably, in this embodiment, the first and the second semiconductor component form a series circuit. Furthermore, the conversion element in this case has, in particular, a negative temperature coefficient.

As the temperature rises, the resistance of the resistance element decreases, such that more current flows through the first and second semiconductor components, as a result of which at higher temperatures it is possible to counteract a decrease in the light intensity of the light emitted by the first semiconductor component. At the same time, by increasing the current through the second semiconductor component, it is possible for more blue light to be generated and converted, such that it is possible to counteract a color locus shift in the direction of blue color locus coordinates on account of a temperature-dictated decrease in the efficiency of the conversion element.

In the case of a conversion element having a positive temperature coefficient, the lighting module advantageously comprises a string comprising the resistance element and the first and third semiconductor components, wherein the resistance element forms a series circuit with the first and third semiconductor components and has a negative temperature coefficient. Preferably, in this embodiment, the first and the third semiconductor component form a series circuit.

The effect described can also be obtained in a further embodiment, in which the conversion element has a negative temperature coefficient. In this case, the lighting module comprises a first resistance element having a negative temperature coefficient and a second resistance element having a negative temperature coefficient, wherein the first resistance element forms a series circuit with the first semiconductor component and the second resistance element forms a series circuit with the second semiconductor component. Preferably, a first string comprises the first resistance element and the first semiconductor component, while a second string comprises the second resistance element and the second semiconductor component, wherein the first and the second string form a parallel circuit.

In the case of a conversion element having a positive temperature coefficient, the lighting module advantageously comprises a first resistance element having a negative temperature coefficient and a second resistance element having a negative temperature coefficient, wherein the first resistance element forms a series circuit with the first semiconductor component and the second resistance element forms a series circuit with the third semiconductor component. Preferably, a first string comprises the first resistance element and the first semiconductor component, while a second string comprises the second resistance element and the third semiconductor component, wherein the first and the second string form a parallel circuit.

Preferably, in the lighting modules described, at least one of the first, second and third semiconductor components is not connected in series with a resistance element having a temperature-dependent electrical resistance.

In all the embodiments, the mixed light emitted by the lighting module has, in particular in a temperature range of between −40° C. and 150° C., a comparatively stable color locus.

Preferably, in the present case mixed light having a color temperature of between 2400 K and 7000 K is designated as white light or light having a white luminous or color impression.

In accordance with one preferred embodiment, the ratio of a total luminous flux generated by the second semiconductor components to the total luminous flux generated by the third semiconductor components is between 1:4 and 4:1. In particular, the ratio is chosen such that the mixed light generated by the lighting module produces white light. The number of first semiconductor components emitting red light is also chosen depending on the target color locus of the lighting module.

In accordance with one preferred configuration, the red proportion contained in the white light is generated by a semiconductor chip having a semiconductor layer sequence on the basis of InGaAlP. In this context, "on the basis of InGaAlP" means that the semiconductor layer sequence comprises $Al_nGa_mIn_{1-n-m}P$, wherein $0 \le n \le 1$, $0 \le m \le 1$ and $n+m \le 1$. In particular, the red light has a dominant wavelength of between 600 nm and 680 nm, preferably between 615 nm and 660 nm.

Furthermore, the greenish-white proportion contained in the white mixed light is preferably generated by semiconductor chips having a semiconductor layer sequence on the basis of InGaN. In this context, "on the basis of InGaN" means that the semiconductor layer sequence comprises $Ga_mIn_{1-m}N$, wherein $0 \le m \le 1$.

In order to generate the conversion proportion, the second and third semiconductor components each comprise a conversion element. The conversion element contains at least one conversion substance for converting part of the primary light generated by the semiconductor chip into secondary light. In particular, a YAG-based phosphor is appropriate as conversion substance. By way of example, the conversion substance is embedded into a matrix material such as silicone.

The conversion elements used for the second and third semiconductor components preferably comprise the same conversion substance. By way of example, the concentration of the conversion substance can be lower in the case of the third semiconductor component than in the case of the second semiconductor component, such that the light emitted by the second semiconductor component has a higher conversion proportion than the light emitted by the third semiconductor component. Furthermore, the thickness of the conversion element can be greater in the case of the second semiconductor component, such that the path length within the conversion element is greater and thus leads to a higher conversion proportion than in the case of the third semiconductor component.

In accordance with the first variant, the conversion element has a negative temperature coefficient. In this case, the conversion element contains, in particular, no filling material.

In accordance with the second variant, the conversion element has a positive temperature coefficient. In this case, in addition to the conversion substance a filling material can be embedded into the matrix material. Use is advantageously made of a filling material which, at room temperature, has a refractive index similar to that of the matrix material and the refractive index of which remains constant as the temperature rises, while the refractive index of the matrix material decreases. In particular, the difference between the refractive indices at room temperature is not greater than 0.03. The filling material can comprise, for example, glass particles such as SiO2 particles or ceramic particles such as Al2O3 particles, while the matrix material contains silicone, for example. As the temperature rises, on account of the increasing difference in the refractive index between filling material and matrix material, scattering occurs to an increased extent, which leads to more conversion.

In accordance with one preferred embodiment, the light emitted by the second semiconductor component has a color locus having the color coordinates cx between 0.37 and 0.45 and cy between 0.44 and 0.61. Furthermore, the light emitted by the third semiconductor component preferably has a color locus having the color coordinates cx between 0.1 and 0.31 and cy between 0.1 and 0.32.

In accordance with one advantageous development, the lighting module comprises at least one fourth semiconductor component which differs from the first, second and third semiconductor components in terms of light intensity and/or color locus of the emitted light. By way of example, the luminous efficiency, the light intensity or the color rendering of the lighting module can be improved as a result.

In one preferred configuration, the fourth semiconductor component forms a series circuit with an arrangement comprising the at least one first, second and third semiconductor component and the at least one resistance element. As a result, the resistance element is of lesser significance in terms of voltage technology.

In accordance with one advantageous embodiment, the fourth semiconductor component forms a parallel circuit with an arrangement comprising the at least one first, second and third semiconductor component and the at least one resistance element. With a large number of semiconductor components, excessively high voltages can thereby be avoided. Furthermore, an adaptation to the driver electronics can advantageously be performed by connecting in fourth semiconductor components.

Overall, the efficiency of the overall system can be improved by connecting in at least one fourth semiconductor component.

If the fourth semiconductor component is provided for improved circuitry operation of the lighting module, then it is advantageous if the fourth semiconductor component emits monochromatic light in a wavelength range of between, in particular, 450 nm and 600 nm.

If the fourth semiconductor component is provided for improving the color rendering of the mixed light emitted by the lighting module, then it is advantageous if the fourth semiconductor component emits converted, in particular yellow, light.

In accordance with one preferred embodiment, the lighting module comprises at least one resistance element having a temperature-independent electrical resistance, which means that the electrical resistance is approximately constant across wide temperature ranges, in particular between −40° C. and 150° C. This does not apply, for example, to the abovementioned resistance element having a temperature-dependent resistance, which has a positive or negative temperature coefficient, wherein the electrical resistance becomes higher or lower as the temperature rises, and is accordingly not constant.

In particular, the resistance element having a temperature-independent electrical resistance has an ohmic resistance.

The at least one resistance element having a temperature-independent electrical resistance can be arranged within a string comprising the first, second or third semiconductor component and can be connected in series with at least one of said semiconductor components.

In one advantageous development, the lighting module comprises at least two resistance elements having a temperature-independent electrical resistance, wherein each semiconductor component forms a series circuit with a resistance element.

In accordance with one preferred configuration, the at least one resistance element having a temperature-independent electrical resistance has a programmable electrical resistance. The electrical resistance can be fixedly programmed into the resistance element, thus resulting in a permanent offset of the color locus in the lighting module. By way of example, manufacturing tolerances or saturation fluctuations can be compensated for by a permanent offset of the color locus.

In one advantageous embodiment, the lighting module comprises a plurality of first, a plurality of second and a plurality of third semiconductor components, wherein the semiconductor components of the same type form a series circuit. The semiconductor components of the same type emit equally colored light. The lighting module can comprise a first string comprising a plurality of first and second semiconductor components connected in series and a second string comprising a plurality of third semiconductor components connected in series. Alternatively, the lighting module can comprise a first string comprising a plurality of first semiconductor components connected in series, a second string comprising a plurality of second semiconductor components connected in series and a third string comprising a plurality of third semiconductor components connected in series.

BRIEF DESCRIPTION OF THE DRAWINGS

The lighting module described here is explained in greater detail below on the basis of exemplary embodiments and with reference to the associated figures.

DETAILED DESCRIPTION

Elements that are identical, of identical type or act identically are provided with the same reference signs in the figures.

Figure 1:
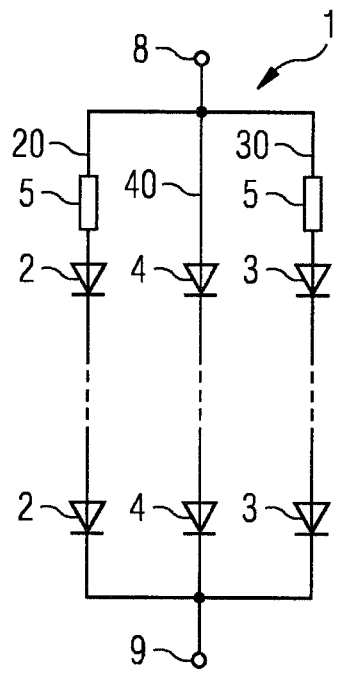
FIGS. 1 to 7 show equivalent circuit diagrams of different exemplary embodiments of the lighting module described here.

FIG. 1 illustrates an equivalent circuit diagram of a first exemplary embodiment of a lighting module 1 in accordance with the present application.

The lighting module 1 comprises a plurality of first semiconductor components 2, a plurality of second semiconductor components 3 and a plurality of third semiconductor components 4.

All the first semiconductor components 2 are arranged within a first string 20 and form a series circuit. Furthermore, all the second semiconductor components 3 are arranged within a second string 30 and form a series circuit. Furthermore, all the third semiconductor components 4 are arranged within a third string 40 and form a series circuit. The dashed lines symbolize possible further semiconductor components. The three strings 20, 30, 40 are connected in parallel with one another.

The first semiconductor components 2 preferably comprise in each case a semiconductor chip comprising a semiconductor layer sequence on the basis of InGaAlP.

Furthermore, the second and third semiconductor components 3, 4 preferably each comprise a semiconductor chip comprising a semiconductor layer sequence on the basis of InGaN. In order to generate the conversion proportion, the second and third semiconductor components 3, 4 each comprise a conversion element. The conversion element contains at least one conversion substance for converting part of the primary light generated by the semiconductor chip into secondary light. In particular, a YAG-based phosphor is appropriate as conversion substance. The conversion element can be arranged in the form of a small plate directly on a radiation exit side of the semiconductor chips. The conversion elements used for the second and third semiconductor components 3, 4 preferably comprise the same conversion substance. In particular, the second and third semiconductor components 3, 4, in the embodiment illustrated in FIG. 1, each comprise a conversion element having a negative temperature coefficient.

The lighting module 1 comprises a first and a second resistance element 5. The first resistance element 5 is arranged within the first string 20 and forms a series circuit with the first semiconductor components 2. The second resistance element 5 is arranged within the second string 30 and forms a series circuit with the second semiconductor components 3. The two resistance elements 5 have a temperature-dependent electrical resistance. In the exemplary embodiment illustrated in FIG. 1, the two resistance elements 5 have a negative temperature coefficient. No resistance element having a temperature-dependent resistance is situated in the third string 40.

During operation, the light module 1 is supplied with current via two electrical connections 8, 9. In this case, the first semiconductor components 2 emit unconverted red light. The second semiconductor components 3 emit converted greenish-white light having a first conversion proportion. The third semiconductor components 4 emit converted greenish-white light having a second conversion proportion, which is less than the first conversion proportion.

In particular, the red light has a dominant wavelength of between 600 nm and 660 nm, preferably between 615 nm and 660 nm. Furthermore, the light emitted by the second semiconductor component 3 has a color locus having the color coordinates cx between 0.37 and 0.45 and cy between 0.44 and 0.61. Furthermore, the light emitted by the third semiconductor component 4 preferably has a color locus having the color coordinates cx between 0.1 and 0.31 and cy between 0.1 and 0.32.

The mixed light emitted by the lighting module 1 has a color temperature of between 2400 K and 7000 K.

During the operation of the lighting module 1, the temperature of the system increases. As the temperature increases, the electrical resistance of the two resistance elements 5 decreases. Consequently, more current can flow through the first and second strings 20, 30. It is thereby possible to counteract a decrease in the light intensity of the red light generated by the first semiconductor components 2. At the same time, it is possible to counteract a decrease in the conversion proportion of the light generated by the second semiconductor components 3.

By means of the two resistance elements 5, it is thus possible to counteract a color locus shift of the mixed light in the direction of blue color coordinates as the temperature increases.

If second and third semiconductor components 3, 4 each having a conversion element having a positive temperature coefficient are used, then the second semiconductor components 3 are interchanged with the third semiconductor components 4. The second string 30 then comprises the third semiconductor components 4 and the resistance element 5 having a negative temperature coefficient. The third string 40 comprises only the second semiconductor components 3.

By means of the two resistance elements 6, it is then possible to counteract a color locus shift of the mixed light in the direction of green color coordinates as the temperature increases.

Figure 2:
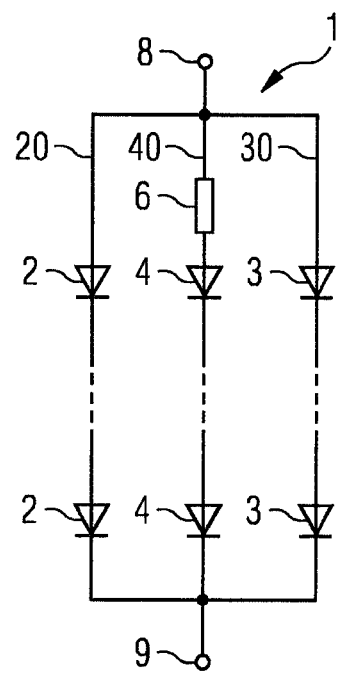

FIG. 2 illustrates the equivalent circuit diagram of a second exemplary embodiment of a lighting module 1 according to the present application.

The lighting module 1 comprises a plurality of first semiconductor components 2, a plurality of second semiconductor components 3 and a plurality of third semiconductor components 4. These have properties such as have already been described in connection with FIG. 1. The three strings 20, 30, 40 composed of different-colored semiconductor components 2, 3, 4 are connected in parallel with one another.

The lighting module 1 comprises a resistance element 6 having a temperature-dependent electrical resistance. The resistance element 6 is arranged within the third string 40 and forms a series circuit with the third semiconductor components 4. The resistance element 6 has a positive temperature coefficient.

As the temperature increases, the electrical resistance of the resistance element 6 rises during operation. Consequently, the current flow through the third semiconductor components 4 decreases. As a result, the light intensity of the light generated by the third semiconductor components 4 decreases. The greenish-white light is therefore attenuated in a manner corresponding to the red light. At the same time, the blue primary light proportion is reduced. This applies to the case where the second and third semiconductor components 3, 4 each have a conversion element having a negative temperature coefficient.

By means of the resistance element 6, it is thus possible to counteract a color locus shift of the mixed light in the direction of blue color coordinates as the temperature increases.

If second and third semiconductor components 3, 4 each comprising a conversion element having a positive temperature coefficient are used, then the second semiconductor components 3 are interchanged with the third semiconductor components 4. The second string 30 then comprises only the third semiconductor components 4. The third string 40 comprises the second semiconductor components 3 and the resistance element 6 having a positive temperature coefficient.

By means of the resistance element 6, it is then possible to counteract a color locus shift of the mixed light in the direction of green color coordinates as the temperature increases.

Figure 3:
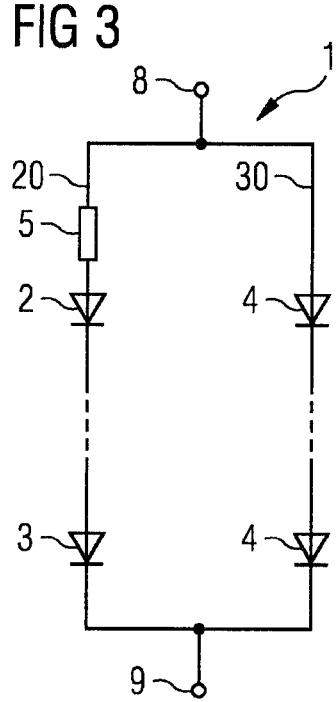

FIG. 3 illustrates the equivalent circuit diagram of a third exemplary embodiment of a lighting module 1 in accordance with the present application.

The lighting module 1 comprises a plurality of first semiconductor components 2, a plurality of second semiconductor components 3 and a plurality of third semiconductor components 4. These have properties such as have already been described in connection with FIG. 1.

The first string 20 comprises the first semiconductor components 2 and the second semiconductor components 3. Within the first string 20, all the semiconductor components 2, 3 are interconnected in series. The second string 30 comprises only the third semiconductor components 4. The two strings 20, 30 are connected in parallel with one another.

The lighting module 1 comprises a resistance element 5 having a temperature-dependent electrical resistance. The resistance element 5 is arranged within the first string 20 and forms a series circuit with the first and second semiconductor components 2, 3. The resistance element 5 has a negative temperature coefficient.

As the temperature increases, the electrical resistance of the resistance element 5 decreases during operation. Consequently, more current can flow through the first string 20. It is thereby possible to counteract a decrease in the light intensity of the red light generated by the semiconductor components 2. At the same time, it is possible to counteract a decrease in the conversion proportion of the light generated by the second semiconductor components 3. This applies to the case where the second and third semiconductor components 3, 4 each have a conversion element having a negative temperature coefficient.

By means of the resistance element 5, it is thus possible to counteract a color locus shift of the mixed light in the direction of blue color coordinates as the temperature increases.

If second and third semiconductor components 3, 4 each comprising a conversion element having a positive temperature coefficient are used, then the second semiconductor components 3 are interchanged with the third semiconductor components 4. The first string 20 then comprises third semiconductor components 4 instead of the second semiconductor components 3. Furthermore, the second string 30 comprises second semiconductor components 3 instead of the third semiconductor components 4.

By means of the resistance element 6, it is then possible to counteract a color locus shift of the mixed light in the direction of green color coordinates as the temperature increases.

Figure 4:
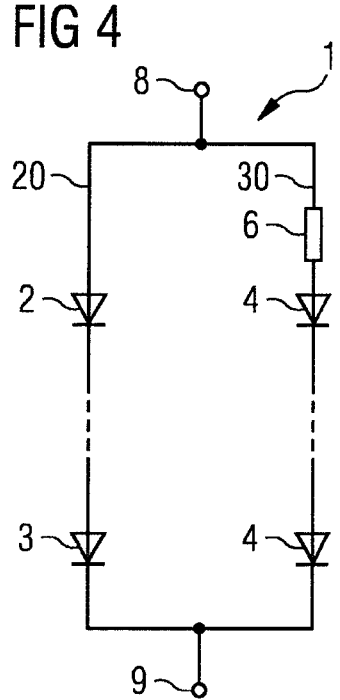

FIG. 4 illustrates the equivalent circuit diagram of a fourth exemplary embodiment of a lighting module 1 in accordance with the present application.

The lighting module 1 comprises a plurality of first semiconductor components 2, a plurality of second semiconductor components 3 and a plurality of third semiconductor components 4. These have properties such as have already been described in connection with FIG. 1.

The first string 20 comprises the first semiconductor components 2 and the second semiconductor components 3. Within the first string 20, all the semiconductor components 2, 3 are interconnected in series. The second string 30 comprises the third semiconductor components 4, which are connected in series. The two strings 20, 30 are connected in parallel with one another.

The lighting module 1 comprises a resistance element 6 having a temperature-dependent electrical resistance. The resistance element 6 is arranged within the second string 30 and forms a series circuit with the third semiconductor components 4. The resistance element 6 has a positive temperature coefficient.

As the temperature increases, the electrical resistance of the resistance element 6 increases during operation. Consequently, the current flow through the third semiconductor components 4 decreases. As a result, the light intensity of the light generated by the third semiconductor components 4 decreases. The greenish-white light is therefore attenuated in the manner corresponding to the red light. At the same time, the blue primary light proportion is reduced. This applies to the case where the second and third semiconductor components 3, 4 each comprise a conversion element having a negative temperature coefficient.

By means of the resistance element 6, it is thus possible to counteract a color locus shift of the mixed light in the direction of blue color coordinates as the temperature increases.

If second and third semiconductor components 3, 4 each comprising a conversion element having a positive temperature coefficient are used, then the second semiconductor components 3 are interchanged with the third semiconductor components 4. The first string 20 then comprises third semiconductor components 4 instead of the second semiconductor components 3. Furthermore, the second string 30 comprises second semiconductor components 3 instead of the third semiconductor components 4.

By means of the resistance element 6, it is then possible to counteract a color locus shift of the mixed light in the direction of green color coordinates as the temperature increases.

Figure 5:
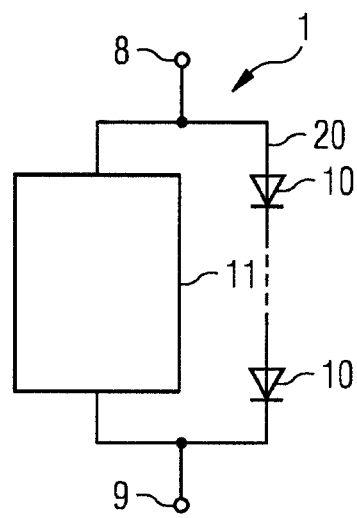

FIG. 5 illustrates the equivalent circuit diagram of a fifth exemplary embodiment of a lighting module 1 in accordance with the present application.

The lighting module 1 comprises an arrangement 11 comprising at least one first, second and third semiconductor component (not designated) and at least one resistance element (not designated), and a plurality of fourth semiconductor components 10.

The arrangement 11 has, in particular, a circuit connection, as described in association with FIGS. 1 to 4, of first, second and third semiconductor components and at least one resistance element. The fourth semiconductor components 10 are arranged and interconnected in series within a string 20. The string composed of fourth semiconductor components 10 interconnected in series forms a parallel circuit with the arrangement 11.

The fourth semiconductor components 10 differ from the first, second and third semiconductor components in terms of light intensity and/or color locus of the emitted light.

As a result of the parallel circuit, excessively high voltages can advantageously be avoided in the case of a large number of semiconductor components. Furthermore, an adaptation to the driver electronics can be performed by connecting in the fourth semiconductor components 10.

Figure 6:
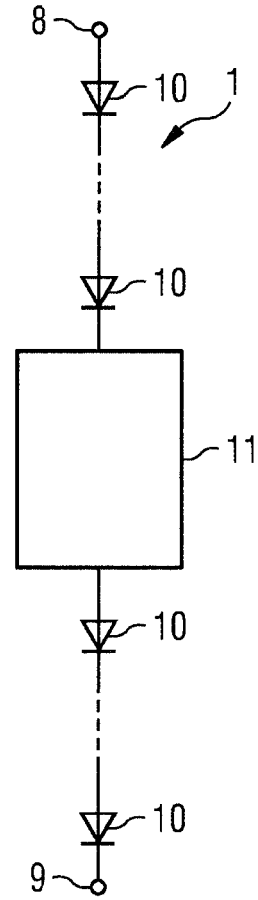

FIG. 6 illustrates the equivalent circuit diagram of a sixth exemplary embodiment of a lighting module 1 in accordance with the present application.

The lighting module 1 comprises an arrangement 11 comprising at least one first, second and third semiconductor component (not designated) and at least one resistance element (not designated), and a plurality of fourth semiconductor components 10.

The arrangement 11 has, in particular, a circuit connection, as described in association with FIGS. 1 to 4, of first, second and third semiconductor components and at least one resistance element. The fourth semiconductor components 10 are connected in series with the arrangement 11. In the case of this interconnection, the resistance element contained in the arrangement 11 is of lesser significance in terms of voltage technology.

The fourth semiconductor components 10 illustrated in FIGS. 5 and 6 can be provided for improved circuitry operation of the lighting module 1 or for improving the color rendering of the mixed light emitted by the lighting module 1.

In the first case, it is advantageous if the fourth semiconductor components 10 emit monochromatic light in a wavelength range of between, in particular, 450 nm and 600 nm.

In the second case, it is advantageous if the fourth semiconductor components 10 emit converted, in particular yellow, light.

Figure 7:
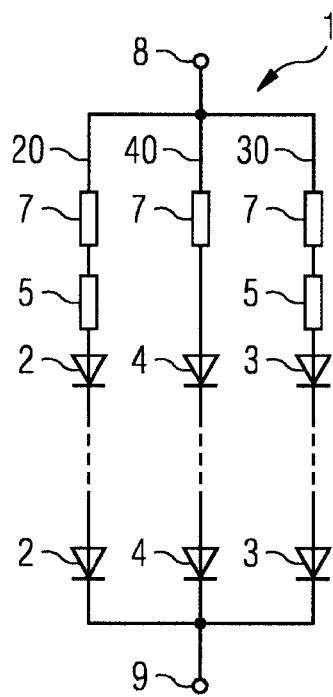

FIG. 7 illustrates the equivalent circuit diagram of a seventh exemplary embodiment of a lighting module 1 in accordance with the present application.

The lighting module 1 has a construction corresponding to the exemplary embodiment illustrated in FIG. 1, comprising three strings 20, 30, 40 of series-connected first, second and third semiconductor components 2, 3, 4, wherein a respective resistance element 5 having a negative temperature coefficient is connected upstream of the first and second semiconductor components 2, 3. Moreover, a respective resistance element 7 having a temperature-independent electrical resistance is connected in series with the first, second and third semiconductor components 2, 3, 4. Preferably, the resistance elements 7 have an ohmic resistance. With further preference, the resistance elements 7 have a programmable electrical resistance. The electrical resistance can be fixedly programmed into the resistance elements 7, such that a permanent offset of the color locus arises in the lighting module 1. By way of example, manufacturing tolerances or saturation fluctuations can be compensated for by means of a permanent offset of the color locus.

Such resistance elements 7 having a temperature-independent electrical resistance can also be provided in the lighting modules 1 in accordance with FIGS. 2 to 6.

Figure 8:
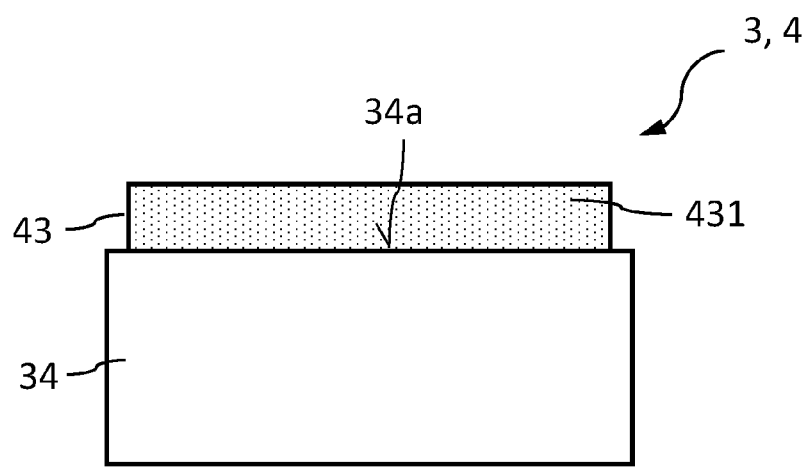
FIG. 8 shows an exemplary embodiment of a second or third semiconductor component.

FIG. 8 shows an exemplary embodiment of the second or third semiconductor component 3, 4. The second and third semiconductor components 3, 4 each comprise a semiconductor chip 34 having a semiconductor layer sequence on the basis of InGaN. In order to generate the conversion proportion, the second and third semiconductor components 3, 4 each have a conversion element 43. The conversion element 43 contains at least one conversion substance 431 for converting part of the primary light generated by the semiconductor chip 34 into secondary light. The conversion element 43 is arranged in the form of a lamella directly on a radiation exit side 34a of the semiconductor chips 34.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102011009697.3, the disclosure content of which is hereby incorporated by reference.

The invention claimed is:

1. A lighting module for emitting mixed light, said lighting module comprising:
at least one first semiconductor component that emits unconverted red light,
at least one second semiconductor component that comprises a conversion element with a conversion substance and emits converted greenish-white light having a first conversion proportion,
at least one third semiconductor component that comprises a conversion element with a conversion substance and emits converted greenish-white light having a second conversion proportion, that is less than the first conversion proportion, wherein the conversion element of the second and third semiconductor components has a positive temperature coefficient such that the conversion element is more efficient as the temperature rises,
at least one resistance element which is an NTC resistance, wherein the resistance element forms a series connection with the third semiconductor component, and wherein
the second semiconductor component is connected in parallel with the third semiconductor component, and wherein the first and the third semiconductor component form a parallel circuit or a series circuit.

2. The lighting module according to claim 1, wherein the first semiconductor component is interconnected with the resistance element, the second and the third semiconductor component in such a way that a color locus of the mixed light is stable as the temperature increases in a temperature range of between −40° C. and 150° C.

3. The lighting module according to claim 1, wherein the first semiconductor component forms a parallel circuit with the second component.

4. The lighting module according to claim 1, which has a string comprising the resistance element and the first and third semiconductor components, wherein the resistance element forms a series circuit with the first and third semiconductor components.

5. The lighting module according to claim 1, which comprises a further resistance element being an NTC resistance, wherein the further resistance element forms a series circuit with the first semiconductor component.

6. The lighting module according to claim 1, wherein the electrical resistance of the resistance element decreases as the temperature rises between −40° C. and 150° C.

7. The lighting module according to claim 1, wherein the conversion element further comprises a matrix material and a filling material, wherein the filling material is embedded into the matrix material.

8. The lighting module according to claim 7, wherein at room temperature, the filling material has a refractive index similar to that of the matrix material.

9. The lighting module according to claim 7, wherein the refractive index of the filling material remains constant as the temperature rises above room temperature, while the refractive index of the matrix material decreases.

10. A lighting module for emitting mixed light, said lighting module comprising:
at least one first semiconductor component that emits unconverted red light,
at least one second semiconductor component that comprises a conversion element with a conversion substance and emits converted greenish-white light having a first conversion proportion, at least one third semiconductor component that comprises a conversion element with a conversion substance and emits converted greenish-white light having a second conversion proportion, that is less than the first conversion proportion, wherein the conversion element of the second and third semiconductor components has a negative temperature coefficient such that the conversion element is less efficient as the temperature rises, at least one resistance element which is an NTC resistance, wherein the resistance element forms a series connection with the second semiconductor component, and wherein the second semiconductor component is connected in parallel with the third semiconductor component, and wherein the first and the second semiconductor component form a parallel circuit or a series circuit.

11. A lighting module for emitting mixed light, said lighting module comprising:

at least one first semiconductor component that emits unconverted red light, at least one second semiconductor component that comprises a conversion element with a conversion substance and emits converted greenish-white light having a first conversion proportion, at least one third semiconductor component that comprises a conversion element with a conversion substance and emits converted greenish-white light having a second conversion proportion, that is less than the first conversion proportion, wherein the conversion element of the second and third semiconductor components has a negative temperature coefficient such that the conversion element is less efficient as the temperature rises, at least one resistance element which is a PTC resistance, wherein the resistance element forms a series connection with the third semiconductor component, and wherein the second semiconductor component is connected in parallel with the third semiconductor component, and wherein the first and the second semiconductor component form a parallel circuit or a series circuit.

* * * * *